(12) United States Patent
Paneccasio, Jr. et al.

(10) Patent No.: US 6,375,866 B1
(45) Date of Patent: Apr. 23, 2002

(54) METHOD FOR APPLYING A CONDUCTIVE PAINT COATING AND ARTICLES MADE THEREBY

(75) Inventors: Vincent Paneccasio, Jr., Madison; Mark P. Chasse', West Haven, both of CT (US)

(73) Assignee: Enthone, Inc., West Haven, CT (US)

( * ) Notice: Subject to any disclaimer, the term of this patent is extended or adjusted under 35 U.S.C. 154(b) by 0 days.

(21) Appl. No.: 09/478,951

(22) Filed: Jan. 7, 2000

Related U.S. Application Data (63) Continuation-in-part of application No. 09/136,219, filed on Aug. 19, 1998, now Pat. No. 6,013,203.

(51) Int. Cl.$^7$ ................................................ H01B 1/22
(52) U.S. Cl. ...................... 252/511; 252/512; 252/514; 252/518; 252/520; 252/500; 524/445; 524/337; 524/442; 524/446; 524/435; 524/440
(58) Field of Search ................................ 252/500, 512, 252/514, 518, 520, 511; 524/445, 337, 442, 446, 435, 440

(56) References Cited

U.S. PATENT DOCUMENTS

| | | | |
|---|---|---|---|
| 3,203,820 A | * | 8/1965 | Smith et al. |
| 3,252,820 A | * | 5/1966 | Vignole et al. |
| 4,305,847 A | * | 12/1981 | Stoetzer et al. |
| 4,888,135 A | * | 12/1989 | Tsunaga et al. |
| 4,965,296 A | * | 10/1990 | Hastings |
| 5,061,556 A | * | 10/1991 | Morgan |
| 5,075,039 A | * | 12/1991 | Goldberg |
| 5,120,578 A | * | 6/1992 | Chen et al. |
| 5,158,708 A | * | 10/1992 | Yamamoto et al. |
| 5,282,887 A | * | 2/1994 | Gay et al. |
| 5,340,390 A | * | 8/1994 | Magauran et al. |
| 5,478,895 A | * | 12/1995 | Sugiyama et al. |
| 5,696,196 A | * | 12/1997 | DiLeo |

* cited by examiner

Primary Examiner—Yogendra N. Gupta
Assistant Examiner—Derrick G. Hamlin
(74) Attorney, Agent, or Firm—Senniger, Powers, Leavitt & Roedel (57) ABSTRACT

An electrically conductive paint for applying to substrates to make articles of manufacture including EMI/RFI shielded housings of electronic components and printing plates comprises a cross-linked organic resin binder containing cross-linkable functional groups such as OH groups, electrically conductive metallic particles, preferably a mixture of silver flakes and silver-coated copper flakes, a solvent, a cross-linking agent which cross-links with itself and with the functional groups of the organic binder and preferably a catalyst which accelerates cross-linking of the cross-linking agent and organic binder. Using such a paint formulation it has been found that thinner coatings can be used while still exceeding the properties needed for EMI/RFI shielding of housing for electronic components. A Theological additive which is an organic derivative of castor oil is preferably used to control the viscosity and spraying characteristics of the paint especially in a paint composition containing silver coated copper flakes. The conductive paint provides a sprayed coating which is durable, has low resistivity and is smooth and has both cohesive and adhesive strength. A method is also provided for forming EMI/RFI shielding on housings for electronic components and electronic components made using the method and paint composition of the invention. Another method is provided for making printing plates used to print a design on an article such as a beverage can. The printing plate is made by applying the conductive paint of the invention to a polymer imaged substrate such as a steel plate.

18 Claims, 1 Drawing Sheet

METHOD FOR APPLYING A CONDUCTIVE PAINT COATING AND ARTICLES MADE THEREBY

CROSS-REFERENCE TO RELATED APPLICATION

This application is a Continuation-In-Part application of U.S. Ser. No. 09/136,219 filed Aug. 19, 1998 U.S. Pat. No. 6,013,203.

BACKGROUND OF THE INVENTION

1. Field of the Invention

This invention relates to conductive paint formulations which are useful for coating housings for electronic equipment to provide electromagnetic interference (EMI) and radio frequency interference (RFI) shielding for the housings and which are also useful in making printing plates and other printing devices to provide a durable, ink transferable surface on the printing plate and, in particular, to paint formulations which may be spray coated onto the housing or printing plate to provide a thin durable finish which is both adhesive to the housing substrate and cohesive with the conductive pigment and which has low electrical resistivity.

2. Description of Related Art

It is often necessary to provide EMI/RFI shielding for polymeric and other electrically non-conductive enclosures used in electronic and radio equipment to prevent radiation such as EMI/RFI from being emitted from the equipment contained therein. Regulations of the Federal Communication Commission require that certain categories of electronic and computer equipment be enclosed by shields capable of substantially eliminating such EMI/RFI above about 10 kiloHertz (kHz) in frequency.

It is known in general that electrically conducting materials will provide EMI/RFI shielding and, accordingly, it is common practice in the industry to provide a metal coating on enclosures for electronic equipment. Among the techniques known to apply such a coating are the use of electrically conductive paints, flame or arc metal spraying, the application of metal foils and electroless or electrolytic deposition of one or more metal layers.

The many types of electronic equipment which must be shielded from EMI/RFI radiation include commercial, industrial, business and home products such as computers, calculators, video equipment and electronic games. The use of conductive finishes such as electrically conductive paints on the electronic housing however are subject to failure by abrasion, flaking, cracking or corroding allowing leaking of radiation. For this and other reasons, multiple coatings are typically applied for many applications to provide acceptable shielding properties.

To evaluate the electrical effectiveness of a conductive coating on the electronic housing, a test of surface resistivity-measured in ohm/square—termed "ohms per square" is typically used. Both point to point and surface resistivities are usually measured using standard electronic measuring instruments. The durability of the finish and its adhesion to the electronic component substrate is also an important factor in determining the effectiveness of the coating. The conductive paints used to form conductive coatings employ a metallic additive (pigment) in the paint to provide the conductivity of the coating and the ability of the coating to retain the metallic additive (typically termed "metallic pigment" or "pigment") is also a measure of the effectiveness of the coating and is usually termed "cohesion".

Metal containing conductive paints are very popular from an industrial viewpoint to provide a conductive coating on electronic component housings for shielding purposes because of their cost effectiveness. In general, a conductive paint formulation contains a metal such as nickel, copper, and preferably silver and combinations with silver to provide electrical conductivity, a solvent and a binder of generally a polymeric material which are thermoplastic and which on drying form a hard conductive film. The conductive paints are typically applied by spraying with conventional painting equipment and the coated housings are then usually air-dried. Silver has the highest conductivity and is considered the best type of pigment to use for the most critical applications. The high cost of silver however makes it unattractive for general purpose use. Copper is another metal used in paint but oxidation during use results in loss of conductivity and limits its application. A silver coated copper particle, preferably in the form of flake, has been proposed for use in conductive paints alone as the metal pigment and in admixture with pure silver flake pigment.

At present, conductive paints because of their ease of use and effectiveness are very desirable to use in shielding housings for electronic equipment. There are a number of advantages to the use of conductive paints such as minimal equipment cost, ease of application, and low material cost relative to other conductive finishes. However, coating durability is a significant concern since cracks or chips in the coating or abrasion of the coating will effect the shielding of the coating. The quality of the coating therefore is very important to the shielding effectiveness of the coating. Also, in applying the paint it is usually necessary to employ an agitator or mechanical shaker to keep the relatively heavy metallic particles from settling so a homogeneous mixture is maintained during spray application. In general, for a conductive metal paint, and particularly a conductive paint which is sprayed, it is important that the spray coating be durable, have a high conductivity (low resistivity) and provide a smooth (even) coating. It is also important from a cost and application standpoint that a thin coating be used. Paints even meeting these criteria must also have adhesive and cohesive strength so that the coating adheres to the substrate and the conductive pigment is retained in the paint film. All these properties are now typically balanced because a change in the formulation to achieve a particular result typically has a negative effect on another property. For example, increasing the metallic loading decreases the resistivity but usually causes the paint to have poor cohesion.

In U.S. Pat. No. 5,158,708 an electrically conductive paste is described for screen printing of printed circuit boards to provide an electromagnetic shielding layer. The paste is not used for spray painting of housings for shielding. In U.S. Pat. No. 5,282,887 conductive paints applied by spraying are disclosed containing a pigment grade carbon, a resin, a cross-linking agent and a solvent. U.S. Pat. No. 4,305,847 discloses copper containing compositions for shielding employing organic titanates to stabilize the paint over a long period of time even at elevated temperatures.

Bearing in mind the problems and deficiencies of the prior art, it is therefore an object of the present invention to provide an electrically conductive metallic containing paint for EMI/RFI shielding for housings of electronic equipment which paint provides a durable coating with a low resistivity at thin coatings as low as 0.2 mils and has both excellent adhesion to the substrate and cohesive properties of the coating.

It is another object of the present invention to provide an electrically conductive silver containing paint for EMI/RFI shielding for housings of electronic equipment which paint provides a durable coating with a low resistivity at thin coatings and has both excellent adhesive and cohesive properties.

It is a further object of the present invention to provide an electrically conductive silver coated/copper particle containing paint, preferably in admixture with silver particles, for EMI/RFI shielding for housings of electronic equipment which paint provides a durable coating with low resistivity at thin coatings and has both excellent adhesive and cohesive properties.

It is a further object of the present invention to provide a method for forming an EMI/RFI shielding on substrates such as housings for electronic equipment which method provides a metal coating, preferably a silver paint coating which is durable, has low resistivity at thin coatings and has both excellent adhesive and cohesive properties.

It is an additional object of the present invention to provide a method for forming an EMI/RFI shielding on substrates such as housings for electronic equipment which method provides a silver coated copper particle containing conductive paint, preferably in admixture with silver particles, which conductive paint provides a coating which is durable, has low resistivity at thin coatings and has both excellent adhesive and cohesive properties.

It is another object of the present invention to provide a method for forming an EMI/RFI shielding on substrates such as housings for electronic equipment which method provides a coating which is durable, has low resistivity and provides a smooth finish.

It is a further object of the present invention to provide EMI/RFI shielded housings for electronic equipment which are made using the conductive paints and methods of the present invention.

It is an additional object of the present invention to provide a method for making a printing plate or other printing device useful in the printing or graphic design arts for printing ink designs on substrates and articles such as beverage cans, etc., which printing plates or printing devices are made using the paint and method of the invention.

In another object of the invention, a printing plate is provided which has an enhanced operating life and ink transfer surface.

Another object of the invention is to provide a method for printing patterns on substrates and articles such as beverage cans using the printing plate of the invention.

It is a further object of the invention to provide printed articles, substrates and the like such as beverage cans, etc. which are made using printing plates or other printing devices made using the paint and method of the invention.

Other objects and advantages of the present invention will be readily apparent from the following description.

SUMMARY OF THE INVENTION

The above and other objects and advantages, which will be apparent to one of skill in the art, are achieved in the present invention which is directed to, in a first aspect, an electrically conductive metal containing paint for EMI/RFI shielding for housings of electronic equipment comprising an organic binder resin having crosslinkable functional groups selected for example from the group consisting of —OH, —COOH, —CONH$_2$, —SH, phenolics, —NH$_2$ and —NHCH$_2$OH; electrically conductive metallic particles preferably silver and silver-coated copper flakes and mixtures thereof; a solvent; an effective amount of a cross-linking agent which cross-links with itself and with the functional groups of the organic binder resin; and highly preferably an acid or alkaline catalyst to accelerate cross-linking of the organic binder resin with the cross-linking agent. The use of a binder resin having cross-linkable functional groups in combination with a cross-linking agent and preferably a catalyst to catalyze the cross-linking reaction, has been found to provide a metal containing conductive paint for EMI/RFI shielding which may be applied in thin coatings as low as 0.2 mils yet still have the abrasion resistance (durability), low resistivity and adhesive and cohesive properties needed for EMI/RFI shielding applications and other applications such as the making of printing plates used to ink print articles such as beverage cans whereby the printing plates are made by spraying or applying the conductive paint of the invention to the printing plate.

In another aspect of the invention, an electrically conductive silver containing paint for EMI/RFI shielding for housings of electronic equipment comprises an organic binder resin having crosslinkable functional groups selected for example from the group consisting of —OH, —COOH, —CONH$_2$, —SH, phenolics, —NH$_2$ and —NHCH$_2$OH; electrically conductive silver particles, preferably flakes; a solvent; an effective amount of a cross-linking agent which cross-links with itself and with the functional groups of the organic binder resin; and highly preferably an effective amount of an acid or alkaline catalyst to accelerate cross-linking of the organic binder resin with the cross-linking agent.

In another aspect of the invention, an electrically conductive silver coated copper particle (preferably flake) containing paint for EMI/RFI shielding for housings of electronic equipment comprises an organic binder resin having crosslinkable functional groups selected for example from the group consisting of —OH, —COOH, —CONH$_2$, —SH, phenolics, —NH$_2$ and —NHCH$_2$OH; electrically conductive silver coated copper particles, preferably flakes; a solvent; an effective amount of a cross-linking agent which cross-links with itself and with the functional groups of the organic binder resin; and highly preferably an effective amount of an acid or alkaline catalyst to accelerate cross-linking of the organic binder resin with the cross-linking agent. This paint preferably also contains silver flake in the paint formulation.

In another aspect of the invention, the above paint formulations preferably contain a rheological additive in the paint which rheological additive is highly preferably an organic derivative of castor oil particularly an organic castor oil derivative termed castor wax.

In an additional aspect of the invention, the organic binder resin is a poly (vinyl alcohol-co-vinyl acetate-co-vinyl chloride) terpolymer having a molecular weight of about 15,000 to 25,000 and contains about, by weight %, 5–6 vinyl alcohol content (secondary alcohol), 90 vinyl chloride content and 4 vinyl acetate ester content. The cross-linking agent is preferably a melamine resin which cross-links with itself and also with the hydroxyl groups of the organic binder resin. It is preferred to use an acid catalyst with the cross-linking agent to accelerate the cross-linking of the formulation and it is highly preferred to use an organic acid such as paratoluenesulfonic acid or methanesulfonic acid as the catalyst . It is also preferred to use an anti-settling agent in the above paints to control settling of the metallic particles and the forming of a paint condition known as hard pack.

In another aspect of the invention, is has been found that the catalysis of the cross-linking process be specially controlled depending on the type metallic particles used in the paint formulation. For paints containing pure silver particles, the amount of catalyst is specially controlled to achieve the desired combination of EMI/RFI shielding vis-a-vis the coating thickness. For paint formulations containing silver coated copper particles control of the amount of catalyst used is not as restricted but is still specially controlled and a wider catalyst compositional operating range may be used for most shielding applications compared to pure silver paint formulations.

In another aspect of the invention, the conductive metal paint is preferably prepared as a two component system. In the first component the resin is dissolved in a solvent and then additives, if any, such as a Theological additive and an anti-settling agent, are added using a high speed mixer disperser to homogenize the ingredients. After homogenization, the other additives are added such as the metallic pigments and more solvent if necessary. The metal pigment addition is preferably performed under low speed mixing to prevent distorting of the metallic particles. The cross-linking component is then preferably added as the last component. This composition may be termed "paint component 1". The second paint component comprises an acid or alkaline catalyst for accelerating the cross-linking reaction and a solvent. When the paint is desired to be used, paint component 1 is mixed with paint component 2 and a paint is provided which typically has a pot life of about one day which varies depending on the temperature conditions of use. Additional solvent is usually added to the mixture of paint component 1 and paint component 2 to provide the desired paint viscosity for spraying or other coating applications. The paint is typically sprayed at a temperature of about 20–30° C. Further, retarder solvents may be added to the paint formulation to minimize dry spray which results in loose non-adherent particles on the sprayed surface. Solvents such as butyl cellosolve and diacetone alcohol may be used to slow the evaporation rate of the paint during spraying thus minimizing dry spray.

In another aspect of the invention, a method is provided for applying the paint of the invention to a substrate to make articles of manufacture including EMI/RFI shielded housings for electronic components and printing plates.

In a further aspect of the invention, a method is provided for forming an EMI/RFI shielding for housing for electronic equipment comprising applying an electrically conductive metal paint thereto as defined hereinabove in a shielding effective thickness. It is preferred that the paint be applied by spraying although the paint may be applied by immersion, brushing, etc.

In a further aspect of the invention an EMI/RFI shielded substrate, and in particular, a shielded housing for electronic equipment, is provided which is made by the method of the invention using the various paint formulations of the invention.

To provide a paint formulation needed to coat housing for electronic equipment to provide EMI/RFI shielding, it is conventional to control the pigment to binder ratio to provide the desired properties such as durability, adhesion, cohesion, and low resistivity. It has now been found that the amount of resin used in the paint formulation may be reduced or minimized in a conductive metal paint formulation thereby increasing the pigment/binder ratio while increasing or exceeding the properties of prior art conductive metal paint formulations. The reduction of the amount of the binder enables the use of thinner coatings yet the paint formulation of the invention still exceeds the desired low resistivity values and provides a significantly more durable finish than conventional paints and which paint finish has excellent adhesive and cohesive properties. The use in a metal containing paint formulation of a cross-linking agent in combination with a binder resin having functional groups cross-linkable with the cross-linking agent and catalysis of the binder cross-linking agent reaction has been found to provide a paint formulation in which the amount of resin in the paint formulation can be minimized while increasing or exceeding at least some of the shielding properties of prior art conductive metal paints.

In a further aspect of the invention a method is provided for making a printing plate or other printing device which printing plate has a patternable layer on the plate, typically an imageable polymer, with the patternable layer patterned to form a patterned layer, which patterned layer has a transfer ink applied thereto and the ink is transferred from the patterned layer in the patterned design to an article or substrate to be printed such as a beverage can, the method comprising the steps of:

coating a patterned substrate with a paint of the invention, the substrate preferably having a coating of an imageable polymer thereon which polymer has been imaged with the pattern;

curing the paint to form a printing plate or device having a durable, ink transferable patterned surface.

In a further aspect of the invention a method is provided for printing with a printing plate or other printing device which printing plate has a patternable layer on the plate, typically an imageable polymer, with the patternable layer patterned to form a patterned layer, which patterned layer has a transfer ink applied thereto and the ink is transferred from the patterned layer in the patterned design to an article or substrate to be printed such as a beverage can, the method comprising the steps of:

applying printing ink to a printing plate of the invention covering a patterned layer on the printing plate;

transferring the ink from the patterned layer of the printing plate to a substrate or article to be printed with the pattern and printing the pattern on the substrate; and repeating, if necessary, the steps for applying printing ink to one or more other printing plates and transferring the ink to the substrate to make desired patterns on the substrate which plates are used sequentially to provide multiple ink coatings on the substrate to make the final patterned product.

In a further aspect of the invention a method is provided for making a printing plate or other printing device which printing plate has a patternable layer on the plate with the patternable layer patterned to form a patterned layer, which patterned layer has a transfer ink applied thereto and the ink is transferred from the patterned layer in the patterned design to an article or substrate to be printed such as a beverage can, the method comprising the steps of:

supplying a substrate preferably metallic and preferably in the form of a sheet which is bendable;

preferably applying an adherent layer which adheres to the substrate, preferably polymeric, and which provides an adhesive surface;

coating the substrate or preferably a substrate containing an adherent layer with an imageable material such as a polymer forming an imageable (or patternable) layer of the material;

patterning the imageable layer by removing portions of the imageable layer and/or forming openings in the imageable layer with the patterned layer forming the desired pattern to be transferred to an article;

coating the patterned layer containing substrate with a paint of the invention; and curing the paint and forming a printing plate or device having a durable ink transferable patterned surface.

In another aspect of the invention, a printing plate or device is provided which is made using the paint of the invention comprising a substrate having a patterned layer thereon, and a paint coating on the patterned layer which paint coating has been cured, the printing plate having enhanced operating life and ink transferable patterned surface.

In a further aspect of the invention graphic design ink printed articles such as beverage cans, toys, and printed matter and the like are made using the method and printing plate or device of the invention.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1 and 2 of the drawings in which like numerals refer to like features of the invention. Features of the invention are not necessarily shown to scale in the drawings.

In the present invention electrically non-conductive substrates used for electronic component enclosures may comprise any suitable material having the requisite structural strength or other characteristics desirable and necessary for the particular use to which the final product is to be put. Typically, this is a cabinet adapted to receive a radio, computer, microwave oven or similar electronic equipment and can be made of any suitable electrically non-conductive or dielectric material such as any thermosetting or thermoplastic resin or other suitable material which can be molded to produce a finished enclosure. Generally, suitable moldable synthetic organic polymeric materials such as acrylonitrile-butadiene-styrene (ABS), polystyrene, polycarbonate, polyacetal or any suitable plastic or reinforced plastic material or blends thereof can be used. Other dielectric materials, such as glass, ceramic, glass fiber, reinforced ceramic, cellulose, pressed fiberboard or composite materials made therefrom are also known to be used for such purposes and may therefore be used as the substrate material for the purpose of this invention.

Other substrates such as a metal sheet containing a pattern thereon may be used to make printing plates using the paint and method of the invention. Typically, a preferably bendable sheet such as a steel sheet, is used as a substrate for a printing plate and an imageable (patternable) coating, e.g., a polymer, is formed on the steel sheet. Other metals such as aluminum, magnesium and the like may also be used as the substrate, with or without protective coatings. Non-metals such as plastics may also be employed. The sheet is preferably bendable to be useful with printing machines which typically bend the sheet when transferring ink from the printing plate to the article or substrate to be printed.

A polymer adhesive first layer is typically used as a base on the steel sheet to adhere an imageable coating (e.g., polymer) to the adhesive containing steel sheet. The polymer coating is imageable, usually photoimageable, and a design (pattern) is formed on the polymer coating by photoengraving, photolithographing or other means to form the desired pattern in the polymer layer. The pattern is made by forming openings in the polymer layer and/or removing portions of the layer wherein the remaining patterned polymer coating layer carries the ink in the desired pattern. The patterned layer is then painted and cured using the paints and method of the invention.

The pattern is transferred to an article or substrate such as a beverage can when the printing plate is contacted with a transfer ink and then the inked plate typically contacted with a transfer means which transfer means contains the design pattern thereon in the form of ink which transfer means then contacts the article to be printed. The ink is transferred from the printing plate to the transfer means and then to the article and the process is repeated sequentially if necessary using multiple printing plates each with a different pattern and color if multiple color articles are desired.

Imageable polymers useful to provide a coating on the metal substrate can be acrylic or other curable based material, and contain photoinitiators for photoimaging. A typical imaging procedure is to photoimage the polymer layer, develop and rinse away the unwanted polymer leaving a patterned layer in the form of openings in the layer and/or removed portions of the layer, with the remaining layer defining the pattern and ink transfer surface. The printing plates of the invention have been found not only to have an excellent ink transfer surface but also to have enhanced operating life because of the paint coating thereon. Positive and negative imageable polymers may be used as the patternable layer as known in the art.

In general and an important feature of the invention is that the surface of the housing to which the paint is to be applied does not typically require etching or mechanical roughening since the paint and the method of the invention require no special surface treatment operation other than normal cleanup used to remove traces of mold release, oil, dirt and other contamination which may be on the surface to be coated.

Any suitable resin may be used as the organic binder resin in the invention with the proviso that the resin has functional groups which are cross-linkable with the cross-linking agents used in the paint formulation and method of the invention to form a three-dimensional polymer network. It is also preferred that the resin have a molecular weight typically above about 5000, and preferably above about 15,000 because of its demonstrated effectiveness. The preferred organic binder resin because of its demonstrated effectiveness is a poly (vinyl chloride-co-vinyl acetate-co-vinyl alcohol) terpolymer containing, by weight %, about 5–6 vinyl alcohol content, 4 vinyl acetate ester content and about 90 vinyl chloride content which vinyl chloride is generally inert in this system. Other binder resins include polyesters, polyurethanes, phenolics, alkyds, polyols, acrylics, and the like.

The cross-linking agent is preferably a melamine resin which cross-links with itself (self-condensation) and also with functional groups of the binder resin such as —OH groups. Other cross-linking agents include urea-formaldehyde, urethane, urea-melamine, modified melamine resins, e.g., phenol modified, modified urea resins, e.g., butylatol, guanamine, alkyl etherified melamine resins, and the like.

Any solvent may be used in the paint formulation with the solvent preferably dissolving the binder resin and cross-linking agent. Solvents such as methyl isobutyl ketone (MIBK) and acetone are preferred because of their demonstrated effectiveness. Other solvents such as esters, ketones, alcohols and the like may be employed. For water based systems, water is the solvent and the resin may be dispersed in the water or solubilized therein.

A rheological additive is preferably used in the paint composition of the invention which improves the use and the performance of the paint. A highly preferred additive because of its demonstrated effectiveness is an organic derivative of castor oil. As will be shown hereinbelow, conventional Theological additives such as polymers, clays, silica, etc. are generally not as effective in the crosslinkable metallic pigment paint formulation of the invention compared with the demonstrated superior effectiveness of the castor oil organic derivative. A highly preferred castor oil organic derivative additive is Thixcin R sold by Rheox Company. This material is defined in the Rheox literature as an organic derivative of castor oil and is typically used in a non-polar environment. It is surprising that this positive effect is obtained when the Thixcin R is used in the moderately polar environment of the present paint system.

In U.S. Pat. No. 5,340,390 assigned to Rheox, Inc. and incorporated herein by reference, Thixcin R is defined as hydrogenated castor oil and is termed castor wax. The chemical formula of the castor wax is shown in FIG. 1 of the patent and below. Other castor oil organic derivatives are shown as having lower hydroxyl values such as the seeding resistant castor wax shown in FIG. 2 of the patent and below.

(CASTOR WAX)

It is also preferred to use in the paint formulation an anti-settling agent to minimize "hard pack". Hard packing is when the metallic component or other components of the paint settle to the bottom of the container and the settled material is very difficult to redisperse before the paint can be sprayed or otherwise applied to the electronic equipment. Any suitable conventional anti-settling agent may be employed.

The metal particles useful in the conductive paint of the invention may vary widely and include copper, nickel, silver, silver-coated copper and the like. Other metal containing particles include wear resistant materials such as tungsten carbide (WC). Non-metallic particles such as ferrophos may also be employed for certain applications such as to make printing plates. As noted above however, the type of metal used affects a number of the properties of the paint and paint coating and the metal used in the paint is therefore preferably correlated with, for example, the amount of catalyst used to catalyze the cross-linking reaction. It is highly preferred that the majority of the metallic additive in the paint formulation be in the form of a flake instead of spherical, or other particle shape, e. g., above 50%, preferably above 90% e.g., 100%. The metal particle size distribution is typically about 1–100 microns although lower and higher particle size distributions may be used for certain applications.

In a preferred paint of the invention, the metallic particles are silver coated copper flakes used together with silver flakes preferably in a weight ratio of about 50% silver—50% copper by weight. Flakes generally provide excellent low resistivity values at a relatively low pigment concentration compared with other particle shapes. Preferred metallic flake particles because of their demonstrated effectiveness are silver flakes having a particle size of about 2–20 microns preferably 6–10 microns and silver coated copper flakes having a particle size of about 5–100 microns preferably 40–70 microns. A typical silver coated copper flake contains about 7–15% by weight silver.

The cross-linking resin is preferably a melamine resin which cross-links with itself (self-condensation) and with the functional group or groups of the organic binder resin of the paint The preferred melamine resin is chemically a methylated melamine formaldehyde resin solution containing by weight %, about 86.5–90.5 resin (CAS No. 68002-20-2); 8–12 isopropanol and <1.5 formaldehyde.

A catalyst is preferably used with the cross-linking resin and is preferably an organic acid such as paratoluenesulfonic acid (PTSA) or methanesulfonic acid (MSA). Various salts such as $MgBr_2$, $Al(NO_3)_3$ and other known Lewis Acids and other acid catalysts may also be used. In certain formulations no acid catalyst may be necessary.

As noted above, it has been found that the amount of catalyst used to catalyze cross-linking of the cross-linking agent and the binder resin be specially controlled depending on the type metal used in the paint formulation. As will be shown hereinbelow, for a paint formulation containing silver particles and silver coated copper particles, it is preferred to use an amount of catalyst of about 0.1 to 3.4 g/l most preferably 0.1 to 2.2 g/l of the paint formulation (before thinning) when the paint formulation is used to provide a thickness of about 0.4 mils or less on the housing surface. For thicknesses of 0.4 mils or higher it is likewise preferred to use a catalyst in the amount of about 0.1 to 2.2 g/l but higher amounts up to about 4.5 g/l or higher may be employed if higher resistivities can be tolerated.

With regard to paint formulations containing only silver as the metallic component, the effect of the catalyst on the resistivity of the coated paint is much more pronounced at the lower thicknesses normally used for silver only paint. Thus, at a thickness of 0.2 mils it is highly preferred to use the catalyst in an amount up to about 0.1 to 2.2 g/l. Amounts above this level tremendously increase the resistivity of the coating. While the absolute values of the resistivity are not as high for higher thicknesses of 0.4 mils and 0.5 mils, it is likewise preferred to maintain the catalyst concentration at a level of about 0.1 to 4.5 g/l most preferably 0.1 to 3.4 g/l to achieve the lowest resistivity values of the paint formulation.

In general, and it is an important feature of the invention, the amount of catalyst needed may be minimized without sacrificing paint properties while still achieving low coating resistivities.

In a highly preferred embodiment of the invention, the conductive paint composition is made in a two part system as follows. To make the first component, the resin (organic binder) is dissolved in a solvent such as MIBK to provide a solution. Typically an elevated temperature will be needed to dissolve the resin with a temperature of about 40 to 60° C. being used for the preferred poly (vinyl alcohol-co-vinyl acetate-co-vinyl chloride) terpolymer and MIBK solvent. Mixtures of solvents such as MIBK and acetone may also be used with the acetone preferably being added at the end of the preparation process. Any Theological additive and any anti-settling agent are then added with high speed mixing (dispersion) to provide a homogenous dispersion of the components. A high speed disperser operating at a speed of 6,000–8,000 rpm for example may be used to form the homogenous mixture. The other additives, in particular the metallic additive, are then added at low speed mixing and more solvent such as acetone added if necessary. The cross-linker component is preferably added as the last ingredient to make paint component 1.

The second component comprises a solvent such as isopropanol and an acid or alkaline material used to catalyze the cross-linking agent and is made by mixing the components together to form paint component 2.

A preferred conductive paint formulation which is ready for spraying or otherwise coating the housing comprises the following components:

|  | Formulation (g/l) |
| --- | --- |
| organic resin | 60.5 |
| solvent | 706[1] |
| rheological additive | 2.32 |
| anti-settling agent | 4.65[2] |
| Ag metallic component | 149 |
| Ag/Cu metallic component | 179 |
| cross-linking agent | 15.2[3] |
| catalyst | 1–5 |

[1]mixture of acetone and MIBK
[2]as active ingredient-added as a 20% active slurry
[3]as active ingredient-added as a 90% solution It will be appreciated by those skilled in the art that the amount of components used in the conductive paint formulation such as the organic resin, solvent and metallic pigment may vary widely depending on the type paint desired. With regard to the cross-linking agent, it is preferred to use a stoichiometric amount vis-a-vis the functional groups of the organic resin.

The conductive paint is usually mixed with a solvent to achieve the desired viscosity. Typically the paint ready for coating the substrate has a viscosity generally in the range of about 15 to 30 preferably 17 to 26 as measured by EZ Zahn Cup #2 at a temperature of 25° C. and the paint as described above is usually thinned at a ratio of 2 parts paint to 1 part thinner (solvent). Conventional spray equipment may be used to spray the paint onto a substrate in an effective shielding thickness and the spray equipment will typically employ an agitator to continually mix the paint during the application to prevent settling of the paint components. The resistivity of the paint coating will vary widely depending on the application with lower resistivities being generally preferred. In general, for a 0.5 mil paint thickness for a silver only paint, the resistivity when measured by ohms per square is less than 20 mohms per square , and preferably less than 10 mohms per square . For a paint containing silver particles and silver coated copper particles, the resistivity when measured by ohms per square is less than 40 mohm square for a 0.5 mil thickness, preferably less than 20 mohms per square.

With regard to using the paint of the invention to make printing plates, any of the paints of the invention described above may be used. The conductive paints are preferred because of their demonstrated effectiveness. As described hereinabove, an imageable polymer is coated on a substrate, typically a metal substrate, and the coated substrate patterned and used as a printing plate. The polymer is imaged typically by photolithographic techniques and developed to form a desired pattern in the polymer surface in the form of openings in the polymer and/or to remove portions of the polymer layer with the raised (remaining) surface of the polymer carrying the ink and pattern. After the pattern is formed, the substrate containing the imaged polymer is coated with the paint of the invention preferably by spraying or other conventional painting means. It is important that the paint not fill the openings but only the opening walls since this would interfere with the pattern and/or affect the resolution of the pattern. After plating the imaged polymer surface, the paint coating is cured. Typically, the thickness of the paint coating on the polymer surface is up to about 0.5 mil or more, preferably about 0.1 mil. As will be appreciated thicker coatings have lower pattern resolution.

After curing of the paint coated substrate, the patterned substrate is now ready for use as a printing plate without the need for any intermediate steps such as electroplating the polymer surface or other processes used in the prior art to make an ink transferable surface. The ink transferable surface is formed by the paint of the invention. Another advantage of the paint of the invention is that the printing plate may be bent or otherwise stressed as typically occurs in printing processes without breaking the ink transferable surface and deleteriously affecting the pattern.

The printing plate is typically used by positioning the printing plate in a printing device and ink is applied to the printing plate surface. An ink transfer means such as a porous plate or sponge contacts the inked printing plate and the sponge holds the ink in the same pattern as on the printing plate. The sponge then contacts the article to be printed and the ink on the sponge in the form of the design is transferred to the article. For multi-colored or other patterns requiring multiple printing plates and printing steps a number of printing plates are used sequentially with different patterns and/or colored inks thereon with each printing plate forming its own pattern on the article. Multi-colored beverage cans having different colored designs thereon is a typical example of the use of sequential printing plates.

Figure 1:
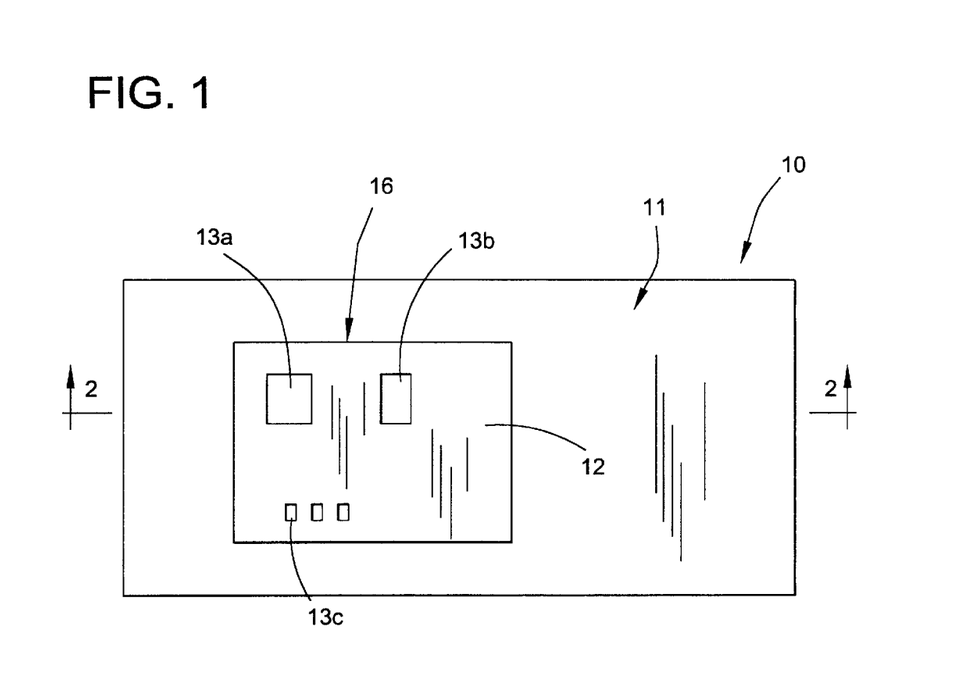
FIG. 1 is a plan view of a printing plate of the invention.

Referring now to the figures, FIG. 1 is a plan view of a printing plate of the invention. The printing plate is shown generally as 10 and has an upper surface 11 which is a cured paint layer on the surface of the printing plate 10 as discussed hereinbelow in FIG. 2. The printing plate has a design 16 thereon having a number of openings therein shown as 13a, 13b and a series of openings collectively as 13c which together form a pattern 16 in the plate 10. The pattern is formed from an imaged layer 12.

Figure 2:
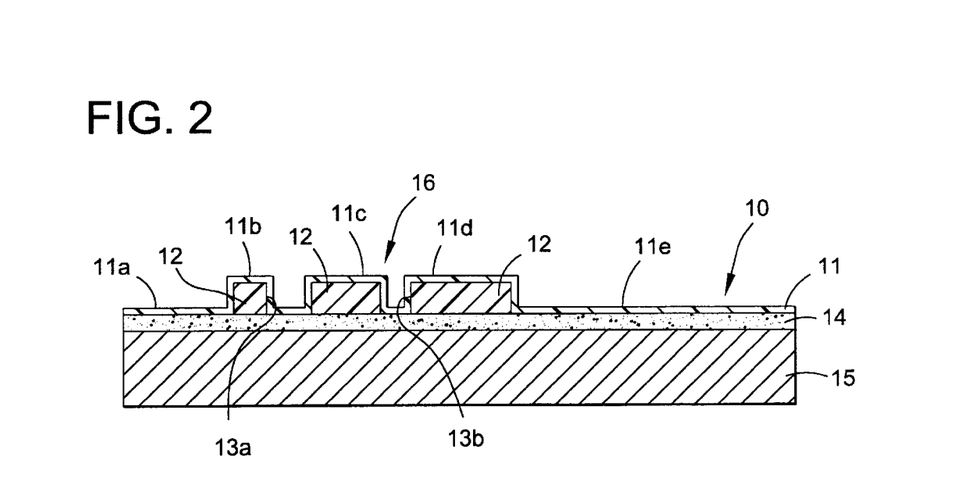
FIG. 2 is a side cross-sectional view of the printing plate of FIG. 1 taken along line 2—2.

Referring now to FIG. 2, the printing plate 10 comprises a substrate 15 which is typically a metal plate which plate has an adhesive coating 14 thereon. A polymer layer 12 forms a pattern 16 on plate 10 which polymer layer has openings 13a and 13b therein. A paint coating 11 covers the adhesive layer 14 and the pattern polymer layer 12 forming surfaces 11a–11e. Surfaces 11b, 11c and 11d form the ink transferable surface of the pattern. Surfaces 11a and 11e represent portions of the polymer layer 12 which were removed when the polymer layer was imaged and developed to form the pattern 16. Openings 13a and 13b also have a paint coating 11 on the walls thereof but like surfaces 11a and 11e are not ink transferable surfaces. An ink applied to the printing plate will cover all the surfaces but the ink will only be transferred to the article or transfer means by surfaces 11b, 11c and 11d forming the pattern on the substrate to be printed or ink transfer means as discussed above.

As can be seen when viewing both FIGS. 1 and 2, the pattern on printing plate as 16 including openings 13a–13c. The remaining part of the printing plate 10 is not used as a patterned ink transferable surface.

The present invention will now be described in more detail by referring to the following examples although the present invention is not limited to them. In the following examples, all parts are by weight and degrees centigrade unless otherwise indicated.

EXAMPLE 1

A paint formulation containing both silver flakes and silver coated copper flakes was prepared as follows. 60.5 g of the poly(vinyl alcohol-co-vinyl chloride-co-vinyl acetate ester) terpolymer resin described above containing by weight %, 5–6 vinyl alcohol content, 4 vinyl acetate ester content and 90 vinyl chloride content was dissolved in 398 g of MIBK at 40–50° C. 4.65 g of an anti-settling agent (added as a 20% active slurry of 23.25 g) and 2.32 g of Thixcin R were added to the solution at high speed mixing to provide a homogenous dispersion of the components. A Dispermat CV high speed disperser with a 40 mm blade operating at 3500–4000 ft/min peripheral tip speed at 5–20 minutes was used to form the homogenous mixture. 179 g of a silver coated copper flake containing about 7–9 weight % silver and having a particle size of 40–50 microns and 149 g of silver flake having a particle size of about 7–10 microns were added to the homogenous mixture with low speed mixing. 307 g of acetone was then added. 18 g of a melamine resin cross-linking agent (90% active) was then added as the last ingredient to make this component (paint component 1) of the paint formulation.

A second paint component 2 contains 171 g of PTSA (189 g of 90.5% PTSA) mixed with isopropyl alcohol to 1 liter volume. Paint component 2 was then added to paint component 1 which was mixed to form the paint formulation. The paint was then thinned with a solvent methyl ethyl ketone (MEK) at 2 parts paint to 1 part thinner so that the final formulation had the same amounts of ingredients except as indicated in Table 1. The catalyst solution of PTSA in isopropyl alcohol was added in the amounts indicated in the table below as g/l, PTSA.

Each paint formulation was then sprayed at 20° C. onto polycarbonate substrates by a high volume, low pressure spray apparatus (HVLP). The coated substrate was cured at the indicated temperatures and the resistivity of the coated surface measured by a point to point measurement and by a surface measurement as indicated in the Table. The results are as shown in Table 1. The point to point resistivities in mohms over a 14 cm. distance were measured using a VERSATRONIC RESISTANCE TESTER MODEL R-100. The surface resistivities were measured using a HEWLETT PACKARD 34401 A Multimeter. The surface resistivity values are in mohms per square. A tape test was also used to determine the cohesiveness of the metal pigment in the coating. Non-acceptable (NA) indicates metal particle pick-off over the whole tape. Acceptable (A) indicates slight metal particle pick-off on the tape. Excellent (E) indicates substantially no metal particle pick-off on the tape. All coatings were adhesive to the substrate. Wear resistance was measured by using a Model 7-IBB Norman Tool, Inc. Abrasion Wear Tester at a 275 gram load which is a conventional tester used in the paint industry. The wear resistance values are measured in cycles required to wear through to the substrate.

TABLE 1

| Comp. | Cure 170° | | | Cure 230° | | | |
|---|---|---|---|---|---|---|---|
| | Pt/Pt | Surface | Cohesion | Pt/Pt | Surface | Cohe-sion | Wear Res. |
| THICKNESS 0.4 MILS | | | | | | | |
| NO CX | 110 | 29 | NA | 76 | 20 | NA | 11 |
| CX | 132 | 33 | NA | 121 | 33 | NA | 14 |
| CX + 1.12 | 125 | 30 | A | 116 | 29 | A | 72 |
| CX + 2.24 | 117 | 25 | A | 101 | 21 | E | 187 |
| CX + 3.39 | 189 | 58 | A | — | — | E | 729 |
| CX + 4.52 | 243 | 65 | A | — | — | E | 1,000 |
| THICKNESS 0.6 MILS | | | | | | | |
| NO CX | 42 | 12 | NA | 32 | 7 | NA | 37 |
| CX | 49 | 10 | NA | 43 | 9 | NA | 125 |
| CX + 1.12 | 38 | 10 | E | 34 | 10 | E | 1430 |
| CX + 2.24 | 53 | 12 | E | 45 | 12 | E | 1040 |
| CX + 3.39 | 59 | 14 | E | — | — | E | 2525 |
| CX + 4.52 | 69 | 19 | E | — | — | E | 2075 |
| THICKNESS 0.9 MILS | | | | | | | |
| NO CX | 25 | 8 | NA | 17 | 3 | NA | 220 |
| CX | 25 | 25 | NA | 21 | 21 | NA | 420 |
| CX + 1.12 | 26 | 7 | E | 23 | 5 | E | 2,205 |
| CX + 2.24 | 37 | 9 | E | 30 | 10 | E | 3,358 |
| CX + 3.39 | 37 | 8 | E | — | — | E | 4,500 |
| CX + 4.52 | 49 | 11 | E | — | — | E | 3,250 |

No CX means no cross-linker in paint
CX means cross-linker in paint
CX + means the amount of catalyst in the paint in g/l The results shown in Table 1 clearly shows that increasing the amount of catalyst used in the paint formulation increases the resistivity of the coating. The effect on increasing the resistivity is relatively flat for the 0.4 mils thickness up to 2.24 g/l catalyst. Above this level, the resistivity increases significantly. For thicknesses of 0.6 mils and 0.9 mils higher amounts of the catalyst could be tolerated with levels of 3.39 g/l or less being preferred. The effect of acid catalysis on the wear resistance of the paint film is also clearly evident and is a preferred feature of the invention.

EXAMPLE 2

Example 1 was repeated using a paint formulation containing only silver flakes in an amount of 480 g/l as the metallic component.

The results of the resistivity and cohesion testing are shown in Table 2.

TABLE 2

| Comp. | Cure 150° | | | Cure 230° | | | Wear Res. |
|---|---|---|---|---|---|---|---|
| | Pt/Pt | Surface | Cohesion | Pt/Pt | Surface | Cohesion | |
| THICKNESS 0.2 MLS | | | | | | | |
| NO CX | | | NA | | | NA | 3 |
| CX | 122 | 41 | NA | 105 | 22 | NA | 9 |
| CX + 1.12 | 202 | 55 | E | 103 | 29 | E | 544 |
| CX + 2.24 | 199 | 61 | E | 108 | 26 | E | 500 |
| CX + 3.39 | 346 | 85 | E | 191 | 47 | E | 400 |
| CX + 4.52 | 487 | 112 | E | 263 | 64 | E | — |
| THICKNESS 0.4 MLS | | | | | | | |
| NO CX | | | NA | | | NA | 9 |
| CX | 52 | 14 | NA | 43 | 12 | E | 150 |
| CX + 1.12 | 59 | 17 | E | 31 | 11 | E | 1375 |
| CX + 2.24 | 82 | 28 | E | 60 | 17 | E | 1187 |
| CX + 3.39 | 106 | 28 | E | 55 | 25 | E | 1025 |
| CX + 4.52 | 162 | 37 | E | 65 | 18 | E | 1012 |
| THICKNESS 0.5 MLS | | | | | | | |
| NO CX | | | NA | | | NA | 9 |
| CX | 35 | 9 | NA | 29 | 8 | E | 1,003 |
| CX + 1.12 | 46 | 11 | E | 27 | 10 | E | 2,177 |
| CX + 2.24 | 47 | 12 | E | 32 | 10 | E | 1,518 |
| CX + 3.39 | 71 | 18 | E | 39 | 9 | E | 1,750 |
| CX + 4.52 | 115 | 26 | E | 46 | 13 | E | 1,300 |

As compared to the effects of the catalyst on the paint formulation containing both silver flakes and silver coated copper flakes as shown in Table 1, the effects of the acid catalyst on the silver film resistivity is much more pronounced in a paint formulation containing only silver paint. This is particularly evident at the typically used silver paint thickness of 0.2 mils where the resistivity increased by a factor of about 4 from 122 to 487 for an amount of catalyst of 4.5 g/l when measured on point to point measurement. Increases in resistivity are also evident at higher paint film thickness of 0.4 mils and 0.5 mils. As with the paint formulation of Example 1, catalysis of the paint formulation significantly increased the wear resistance of the paint film and is a preferred feature of the invention.

EXAMPLE 3

The paint of Example 1 was prepared using a number of different Theological additives as indicated in Table 3. The paints were sprayed onto polycarbonate plaques (4 inch×6 inch) and evaluated. Some paints were not sprayed because of their flow properties as determined by dipping a ⅜ inch diameter glass rod into the paint and holding the rod in a vertical position for about 1 minute. The coated rod is then allowed to dry in a horizontal position. The paint coated rod was then evaluated for coverage by examining the rod through a light source. If the light does not pass through the rod, the coating is considered opaque. A slightly shear appearance indicates some light passing through the rod and an acceptable coating. A shear or very shear coating indicates a large amount of light passing through the rod and an unacceptable coating. The coatings on the sprayed plaques all had adhesion to the plaque substrate. This cohesive properties were evaluated as above.

TABLE 3

| Run | Additive | Conc % weight | Viscosity (Zahn EZ#2) | Paint Sprayed | Observations |
|---|---|---|---|---|---|
| 1 | Thixcin R | 0.2 | 19.8 | Y | Slightly shear - no cohesive failure (E) |
| 2 | Thixatrol Plus | 0.4 | 17.6 | Y | Slightly shear |
| 3 | Thixatrol Plus | 0.6 | 20.7 | Y | Less shear than Run 2 - no cohesive failure (E) |
| 4 | Silica | | 17.6 | Y | Shear - poor cohesion (NA) |
| 5 | Organo-clay | | 18.1 | Y | Shear - poor cohesion (NA) |
| 6 | Inorganic Castor Oil derivative | | 17.4 | N | Very shear |
| 7 | Polyamide | | 17.4 | N | Very shear |
| 8 | Polyamide | | 17.8 | Y | Shear - some cohesive failure (A) |

The above results show that Thixcin R is very superior to the other additiveseven at the low 0.2% level. Thixatrol Plus is satisfactory. Thixatrol Plus is a proprietary diamide castor oil derivative made by Rheox, Inc. Run 4 using silica had a poor coating and poor cohesion. Run 5 using an organoclay had a poor coating and poor cohesion. Run 6 using an inorganic castor oil derivative had a very poor coating. Runs 7 and 8 using a polyamide had a poor coating and some cohesion failure. The use of an organic castor oil derivative of Run 1 is clearly the best Theological additive with the paint formulation of the invention.

EXAMPLE 4

A conductive paint as in Example 2 was used to make a printing plate. A bendable steel sheet substrate was coated with an adhesive layer and then with a photoimageable polymer layer. The polymer layer was patterned by photolithographic techniques removing portions of the polymer and forming openings in the remaining polymer surface as shown in FIGS. 1 and 2. The removed portions and openings formed the pattern in the polymer surface with the remaining polymer surface carrying the inked pattern to be transferred. The patterned polymer containing substrate was then painted with the conductive paint by spraying paint onto the imaged polymer surface at 20–30° C. for 15 seconds using conventional paint spraying equipment. A paint thickness of about 0.1 mils was obtained. The openings were not filled but the base and walls of the openings were coated with the paint.

The painted substrate was then cured at about 250° F.–275° F. for 1 hour.

The formed printing plate was then used to print beverage can articles by applying a transfer ink to the cured paint layer and then contacting the ink containing printing plate with a transfer sponge which sponge then contacted the article to be printed. Multiple articles were printed and the results indicate that the pattern transferred from the printing plate to the article was very detailed and commercially acceptable.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for applying a conductive paint coating to a substrate to make an article of manufacture comprising the steps of:

coating a substrate with a paint comprising an organic binder resin having crosslinkable functional groups selected from the group consisting of —OH, —COOH, —CONH$_2$, —SH, phenolic, —NH$_2$ and —NHCH$_2$OH; metallic or non-metallic particles; a solvent; an effective amount of a cross-linking agent which cross-links with itself and with the functional groups of the organic binder resin; and a catalyst to accelerate cross-linking of the organic binder resin with the cross-linking agent; and curing the paint to form the article.

2. The method of claim 1 wherein the particles are electrically conductive metallic particles.

3. The method of claim 1 wherein the article is a printing plate.

4. The method of claim 1 wherein article is an EMI/RFI shielded electronic component housing.

5. The method of claim 1 used for making a printing plate comprising the steps of:

supplying a substrate;

coating the substrate with an imageable material forming an imageable layer of the material;

patterning the imageable layer by removing portions of the imageable layer and/or forming openings in the imageable layer with the patterned layer forming the desired pattern to be transferred to an article;

coating the patterned layer containing substrate with the paint; and curing the paint and forming the printing plate having a durable ink transferable patterned surface.

6. The method of claim 5 wherein the particles are electrically conductive metallic particles.

7. The method of claim 6 wherein the organic binder is a poly (vinyl alcohol-co-vinyl acetate-co-vinyl chloride) terpolymer.

8. The method of claim 7 wherein the metallic particles are silver flakes.

9. A printing plate comprising:

a substrate;

a patterned coating on the substrate; and a cured paint coating on the patterned coating, the paint coating comprising an organic binder resin having crosslinkable functional groups selected from the group consisting of —OH, —COOH, —CONH$_2$, —SH, phenolic, —NH$_2$ and —NHCH$_2$OH; metallic or non-metallic particles; a solvent; an effective amount of a cross-linking agent which cross-links with itself and with the functional groups of the organic binder resin; and a catalyst to accelerate cross-linking of the organic binder resin with the cross-linking agent.

10. A method for printing a substrate comprising the steps of:

applying printing ink to the printing plate of claim 9 covering a patterned layer on the printing plate;

transferring the ink from the patterned layer of the printing plate to a substrate or article to be printed with the pattern and printing the pattern on the substrate; and repeating, if necessary, the steps for applying printing ink to one or more other printing plates and transferring the ink to the substrate to make desired patterns on the substrate which plates are used sequentially to provide multiple ink coatings on the substrate to make the final patterned product.

11. The method of claim 1 for forming an EMI/RFI shielding for a housing of electronic equipment comprising applying to the housing in an effective shielding thickness a metal containing paint and curing the paint and forming the shielded housing.

12. The method for forming an EMI/RFI shielded housing of claim 11 wherein the paint further contains a castor oil organic derivative as a rheological additive.

13. The method for forming an EMI/RFI shielded housing of claim 12 wherein the electrically conductive metal is a mixture of silver flakes and silver-coated copper flakes.

14. The method for forming an EMI/RFI shielded housing of claim 13 wherein the catalyst is an acid in an amount of about 0.1 to 2.2 g/l.

15. The method for forming an EMI/RFI shielded housing of claim 14 wherein the organic binder is a poly(vinyl alcohol-co-vinyl acetate-co-vinyl chloride) terpolymer.

16. The method for forming an EMI/RFI shielded housing of claim 11 wherein the electrically conductive metal is silver flakes.

17. The method for forming an EMI/RFI shielded housing of claim 16 wherein the organic binder is a poly(vinyl alcohol-co-vinyl acetate-co-vinyl chloride) terpolymer.

18. An EMI/RFI shielded housing for an electronic component comprising:

a substrate;

a cured paint coating on the substrate, the paint composition comprising an organic binder resin having crosslinkable functional groups selected from the group consisting of —OH, —COOH, —CONH$_2$, —SH, phenolic, —NH$_2$ and —NHCH$_2$OH; metallic or non-metallic particles; a solvent; an effective amount of a cross-linking agent which cross-links with itself and with the functional groups of the organic binder resin; and a catalyst to accelerate cross-linking of the organic binder resin with the cross-linking agent.

* * * * *